United States Patent [19]

Ishigaki

[11] 4,246,541
[45] Jan. 20, 1981

[54] SYSTEM FOR REMOVING INTERFERENCE DISTORTION IN THE DEMODULATED SIGNAL OF A FREQUENCY-MODULATED SIGNAL

[75] Inventor: Yukinobu Ishigaki, Yamato, Japan

[73] Assignee: Victor Company of Japan, Limited, Yokohama, Japan

[21] Appl. No.: 37,754

[22] Filed: May 10, 1979

[30] Foreign Application Priority Data

May 21, 1978 [JP] Japan .................................. 53-60470

[51] Int. Cl.$^3$ .............................................. H03D 3/00
[52] U.S. Cl. .................................... 329/132; 329/133; 455/305
[58] Field of Search ................ 329/110, 131, 132, 133, 329/136; 455/295, 296, 303–305, 312, 308

[56] References Cited

U.S. PATENT DOCUMENTS

| | | | |
|---|---|---|---|
| 3,568,078 | 5/1971 | Pelchat | 329/110 |
| 3,611,169 | 10/1971 | Hess et al. | 329/132 |
| 4,166,251 | 8/1979 | Ishigaki et al. | 329/132 |

Primary Examiner—David K. Moore
Attorney, Agent, or Firm—Haseltine, Lake & Waters

[57] ABSTRACT

A system comprising a demodulator for demodulating an input FM signal which has been subjected to interference by another FM signal, an envelope detector for detecting the envelope of fluctuation of the amplitude of the input signal, an AGC circuit for controlling the level of the input signal supplied to the envelope detector, a capacitor for passing only the AC component of the output of the envelope detector, a first delay circuit for delaying the AC component by a specific delay time, a circuit having a transfer characteristic of a hyperbolic function and converting the waveform of the output of the first delay circuit, an analog multiplier supplied at its x input terminal with the output of the waveform converting circuit and producing a distortion cancellation signal, a second delay circuit for delaying the output demodulated signal of the demodulator by the specific delay time, a first operation circuit supplied with the output signal of the second delay circuit and with the distortion cancellation signal and carrying out an operation such as substantially cancelling the interference distortion of the demodulated signal with the distortion cancellation signal, and a second operation circuit supplied with the output signal of the first operation circuit and the output signal of the demodulator, thereby carrying out a signal combining operation and supplying the resulting output signal to the y input terminal of the analog multiplier. The output of the first operation circuit is a demodulated signal in which the interference distortion has been cancelled and thus removed.

7 Claims, 8 Drawing Figures

SYSTEM FOR REMOVING INTERFERENCE DISTORTION IN THE DEMODULATED SIGNAL OF A FREQUENCY-MODULATED SIGNAL

BACKGROUND OF THE INVENTION

The present invention relates generally to systems for removing interference distortion such as multipath distortion contained in signals obtained by demodulating frequency-modulated signals. More particularly, the invention relates to a system wherein a distortion component closely approximating an interference distortion contained in a signal obtained by demodulating a frequency-modulated signal is formed and used to cancel and remove the interference distortion.

In general, when a plurality of frequency-modulated signals (hereinafter referred to as FM signals) interfere with each other, interference distortion is produced. This phenomenon occurs in cases such as that, for example, wherein FM signals which have passed through a plurality of propagation paths (multipaths) interfere with each other, and this interference distortion is called multipath distortion. For example, in the case where an FM broadcast wave is directly received at the antenna of an FM receiver and, at the same time, is received after being reflected or diffracted by objects such as buildings, the FM signals thus received after passing through multipaths in this manner interfere with each other and give rise to interference distortion in the demodulated signal.

In order to reduce the generation of multipath distortion of this character, it has been a practice in known FM receivers to use antennas of sharp directional characteristic by which only directly arriving FM signals can be readily received, while FM signals arriving after being reflected or diffracted are not easily received. However, the occurrence of multipath distortion cannot be fully reduced by merely relying on only the directional characteristic of the antenna.

Accordingly, a method wherein a signal approximating the interference distortion component is formed by an electrical circuit within the FM receiver and used to cancel the distortion component in the demodulated signal has been tried. In this known method, however, the degree of approximation of the signal caused to approximate the distortion for the purpose of cancelling the distortion component is very rough. For this reason, the signal components of the signal for distortion cancellation and the actual distortion component, strictly speaking, are considerably far apart, whereby distortion cancellation cannot be satisfactorily carried out, and, even after the distortion cancellation operation, a substantial distortion component remains.

In this connection, mutual interference of FM signals is not limited to only FM broadcasting but occurs in other instances such as the case of recording and reproducing of an FM signal on and from a recording medium and the case where there is mismatching between a cable for transmitting an FM signal and the related input and output equipments.

The present applicant has previously proposed a "System for removing interference distortions in the demodulated signal of a frequency-modulated signal" by the Patent Application Ser. No. 909,663 filed May 25, 1978 and now U.S. Pat. No. 4,166,251. As described hereinafter in detail with reference to drawings, this previously proposed system comprises a demodulator for demodulating an input FM signal which has been subjected to interference by another FM signal, an envelope detector for detecting the envelope of fluctuation of the amplitude of the input signal, an AGC circuit for controlling the level of the input signal supplied to the envelope detector, a capacitor for passing only the AC component of the output of the envelope detector, a circuit having a transfer characteristic of a hyperbolic function and converting the waveform of the AC component, an analog multiplier supplied at its x input terminal with the output of the waveform converting circuit and producing a distortion cancellation signal, a first operation circuit supplied with the output signal of the demodulator and with the distortion cancellation signal and carrying out an operation such as substantially cancelling the interference distortion of the demodulated signal with the distortion cancellation signal, a delay circuit for delaying the output signal of the first operation circuit or of the demodulator by a specific time, and a second operation circuit supplied with the output signal of the first operation circuit or of the demodulator and with the output signal of the delay circuit, thereby carrying out a signal combining operation and supplying the resulting output signal to the y input terminal of the analog multiplier. The output of the first operation circuit is a demodulated signal in which the interference distortion has been cancelled and thus removed.

In a case where a level of an unreflected signal directly received from a transmitting antenna (referred as a directly-received signal) is larger than a level of a signal received after being reflected by the building (referred as a reflected signal), a frequency demodulated signal, in which the interference distortion has been reduced or removed, is obtained by the previously proposed system. However, in a case where the level of the directly received signal is smaller than the level of the reflected signal, the previously proposed system is not able to remove the interference distortion but rather increases the distortion.

In actual practice for receiving FM signals, the ratios of magnitudes of levels of the directly-received signal and reflected signal are various according to circumferential conditions around the receiving point or location and conditions of transmitting paths of FM signals. In some above described conditions, there is a case where the level of the reflected signal is larger than that of the directly-received signal. In that case, a received and demodulated signal of larger S/N ratio is obtained by receiving and demodulating the reflected signal rather than the directly-received signal.

SUMMARY OF THE INVENTION

Accordingly, it is a general object of the present invention to provide a novel and useful system for removing interference distortion in the demodulated signal of an FM signal in which system the above described difficulties and problems are overcome.

Another and specific object of the invention is to provide an interference distortion removing system in which a signal for distortion cancellation which closely approximates the interference distortion in a demodulated signal of an FM signal is formed and used to cancel the distortion component.

Still another object of the invention is to provide an interference distortion removing system which is effective and useful in a case where the level of the reflected signal is larger than the level of the directly-received signal. In this system, a waveform conversion circuit is used in a circuit system for forming a signal for distortion cancellation, and a signal for distortion cancellation of excellent degree of approximation with respect to interference distortion is obtained.

Other objects and further features of the invention will be apparent from the following detailed description with respect to preferred embodiments of the invention when read in conjunction with the accompanying drawings.

DETAILED DESCRIPTION

Figure 1:
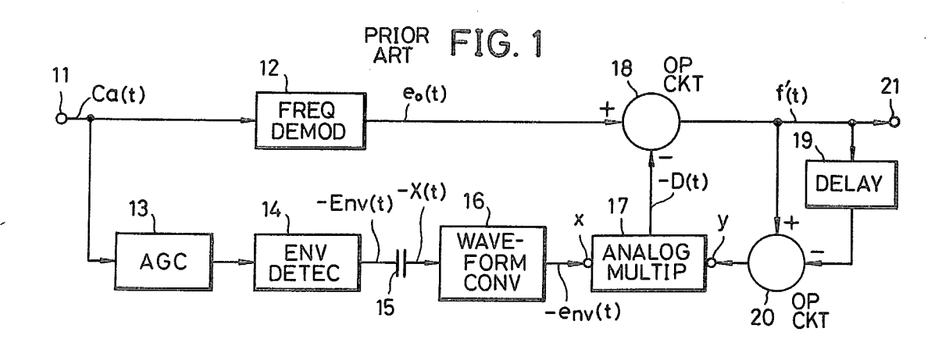
FIG. 1 is a block schematic diagram of an embodiment of an interference distortion removing system proposed previously by the present applicant.
Figure 2:
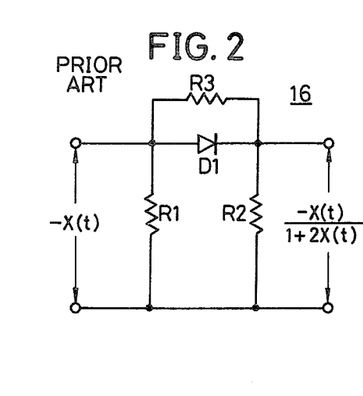
FIG. 2 is a circuit diagram of one embodiment of the waveform conversion circuit in the system shown in FIG. 1.
Figure 3:
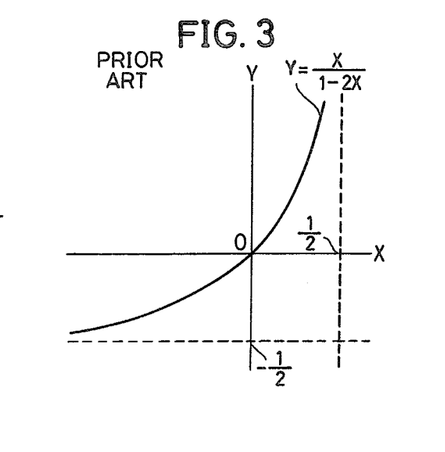
FIG. 3 is a graph indicating a characteristic of the waveform conversion circuit illustrated in FIG. 2.

Referring first to FIGS. 1 to 3, an embodiment of the previously proposed system is described. A frequency-modulated (FM) signal Ca(t) applied to an input terminal 11 of the system is supplied to a frequency demodulator 12, where it is demodulated. At the same time, the input FM signal Ca(t) is supplied through an automatic gain control circuit (AGC circuit) 13 to an envelope detection circuit 14, where its envelope is detected.

In the case where there is an interference distortion, the input FM signal Ca(t) is a combined wave of the direct wave, i.e., the original FM signal C(t) without distortion and the reflected signal, i.e., an FM signal C(t−τ) wherein this signal C(t) has a time delay of τ. Then, these FM signals can be respectively expressed by the following equations in terms of the modulating signal f'(t), where f'(t)=df(t)/dt, the amplitude A of the carrier wave which is frequency modulated by this modulating signal, the carrier wave ωct, and the interference ratio K of the FM signal C(t) and the FM signal C(t−τ), where K=C(t−τ)/C(t)<1.

$$C(t) = A \cos \{\omega ct + f(t)\} \quad (1)$$
$$C(t - \tau) = A \cos \{\omega ct + f(t - \tau) - \theta\} \quad (2)$$
$$Ca(t) = A \cos [\{\omega ct + f(t)\} + K\{\omega ct + f(t - \tau) - \theta\}] \quad (3)$$

$$= A \sqrt{1 + K^2 + 2K\cos\{f(t) - f(t - \tau) + \theta\}} \times$$
$$\cos [\omega ct + f(t) - \tan^{-1} \frac{K\sin\{f(t) - f(t - \tau) + \theta\}}{1 + K\cos\{f(t) - f(t - \tau) + \theta\}}]$$

where, $\theta = \omega c \tau$

An amplitude fluctuation occurs in the FM signal Ca(t) wherein the FM signals C(t) and C(t−τ) are causing an interference. The part represented by A $$\sqrt{1 + K^2 + 2K\cos\{f(t) - f(t - \tau) + \theta\}}$$

in Eq. (3) is the envelope Env(t) of this amplitude fluctuation. Then, when the amplitude A of the carrier wave is taken as 1 (unity), this envelope Env(t) of the amplitude fluctuation is expressed by the following equation.

$$Env(t) = \sqrt{1 + K^2 + 2K\cos\{f(t) - f(t - \tau) + \theta\}} \quad (4)$$

The interference ratio K is a coefficient determined by factors such as the loss incurred when the broadcast wave is reflected by reflecting objects and the damping of a reflected wave in accordance with the directional characteristic of the receiving antenna. Since K is less than 1 (unity), Eq. (4) may be written as follows.

$$Env(t) \approx 1 + K \cos \{f(t) - f(t - \tau) + \theta\} \quad (5)$$

When the above mentioned FM signal Ca(t) is demodulated by the frequency demodulator 12, a demodulated signal $e_o(t)$ expressed by the following equation is obtained.

$$e_o(t) = f'(t) - \qquad (6)$$
$$\frac{K^2\{f'(t) - f'(t-\tau)\} + K\{f'(t) - f'(t-\tau)\}\cos\{f(t) - f(t-\tau) + \theta\}}{1 + K^2 + 2K\cos\{f(t) - f(t-\tau) + \theta\}}$$

When the condition K<1 is considered, Eq. (6) becomes as follows.

$$e_o(t) = \qquad (7)$$
$$f'(t) - \{f'(t) - f'(t - \tau)\} \frac{K \cos\{f(t) - f(t - \tau) + \theta\}}{1 + 2K\cos\{f(t) - f(t - \tau) + \theta\}}$$

By substituting X(t) for the quantity $K \cos \{f(t) - f(t - \tau) + \theta\}$ in the second term on the right-hand side of Eq. (7), the following equation is obtained.

$$e_o(t) = f'(t) - \{f'(t) - f'(t - \tau)\} \frac{X(t)}{1 + 2X(t)} \quad (8)$$

Here, since f'(t) is a demodulated signal without distortion within the demodulated signal from the frequency demodulator 12, the second term in the right-hand side of Eqs. (6), (7), and (8) indicates an interference distortion component D(t).

$$D(t) = \{f'(t) - f'(t - \tau)\} \frac{X(t)}{1 + 2X(t)} \quad (9)$$

Accordingly, the demodulated signal $e_o(t)$ is expressed by the following equation.

$$e_o(t) = f'(t) - D(t) \quad (10)$$

This demodulated signal $e_o(t)$ from the frequency demodulator 12 is supplied as a minuend signal to an operation circuit 18.

On the other hand, the above mentioned AGC circuit 13 operates to maintain the input FM signal Ca(t) as an FM signal of constant signal level and to maintain also constant the signal level of the amplitude envelope Env(t) of the FM signal.

The FM signal Ca(t) which has thus been level controlled by the AGC circuit 13 is supplied to the envelope detection circuit 14. The envelope detection circuit 14 is adapted to detect the envelope of negative polarity of the amplitude fluctuation of the FM signal Ca(t) and produces as output an envelope signal $-\text{Env}(t)$. This envelope signal $-\text{Env}(t)$ is the signal expressed by the foregoing Eq. (5) with the negative sign affixed thereto.

This envelope signal $-\text{Env}(t)$ is passed through a capacitor 15 for suppressing DC component, by which its DC component is removed, and the envelope signal $-X(t)$ of its AC component is supplied to a waveform conversion circuit 16. This envelope signal $-X(t)$ of AC component is expressed by the following equation.

$$-X(t) = K \cos \{f(t) - f(t-\tau) + \theta\} \tag{11}$$

In the present embodiment of the invention, the waveform conversion circuit 16 comprises resistors R1, R2, and R3 connected in $\pi$ formation and a diode D1 connected in parallel with the middle resistor R3 as shown in FIG. 2. The waveform conversion circuit 16 has a transfer characteristic of a hyperbolic function $Y = X/(1-2X)$ as indicated in FIG. 3.

The waveform conversion circuit 16 produces as output a converted envelope signal $-e_{nv}(t)$ given by the following equation, which signal is supplied to the x input terminal of an analog multiplier 17.

$$-e_{nv}(t) = -\frac{X(t)}{1 + 2X(t)} \tag{12}$$

As described hereinafter, a demodulated signal $f'(t)$ obtained from the operation circuit 18 is supplied as a minuend signal to an operation circuit 20 and, at the same time, is supplied to a delay circuit 19 for delaying the signal by the time $\tau$. The time delay of the delay circuit 19 is selected, for example to be equal to the time difference between the reflected ratio wave of maximum level among the reflected waves and the unreflected, directly-received wave.

The output signal $f'(t-\tau)$ of the delay circuit 19 is supplied as a subtrahend signal to the operation circuit 20. The operation circuit 20 carries out subtraction of the signals $f'(t)$ and $f'(t-\tau)$ and produces as output a signal expressed by $\{f'(t) - f'(t-\tau)\}$, which is supplied to the y input terminal of the analog multiplier 17. The analog multiplier 17 thereupon carries out multiplication of the signal $-e_{nv}(t)$ expressed by Eq. (12) from the waveform conversion circuit 16 and the signal from the operation circuit 20. The analog multiplier 17 thereby produces as output a distortion cancelling signal $-D(t)$ given by the following equation and supplies this signal as a subtrahend signal to the operation circuit 18.

$$-D(t) = -\{f'(t) - f'(t-\tau)\} \frac{X(t)}{1 + 2X(t)} \tag{13}$$

The signal expressed by Eq. (13) and supplied from the analog multiplier 17 to the operation circuit 18 has the same signal content as the interference distortion component D(t) expressed by Eq. (9) and supplied from the demodulator 12 to the operation circuit 18. In the operation circuit 18, an operation as indicated by the following equation is carried out.

$$e_o(t) - \{-D(t)\} = f'(t) - D(t) - \{-D(t)\} = f'(t) \tag{14}$$

Therefore, a demodulated signal $f'(t)$ from which the distortion component has been removed is obtained as output from the operation circuit 18 and is led out through an output terminal 21.

In the above described previously proposed system, the interference distortion can be removed in a case where the level of the directly-received signal C(t) is larger than the level of the reflected signal $C(t-\tau)$, while the interference distortion cannot be removed in a case where the level of the reflected signal $C(t-\tau)$ is larger than the level of the directly-received signal C(t), because the interference ratio K is greater than 1 (unity) in this case, whereby the above described equations are not established.

Accordingly, the present invention provides a system for being able to remove the interference distortion in a case where the level of the reflected signal is larger than the level of the directly-received signal.

Figure 4:
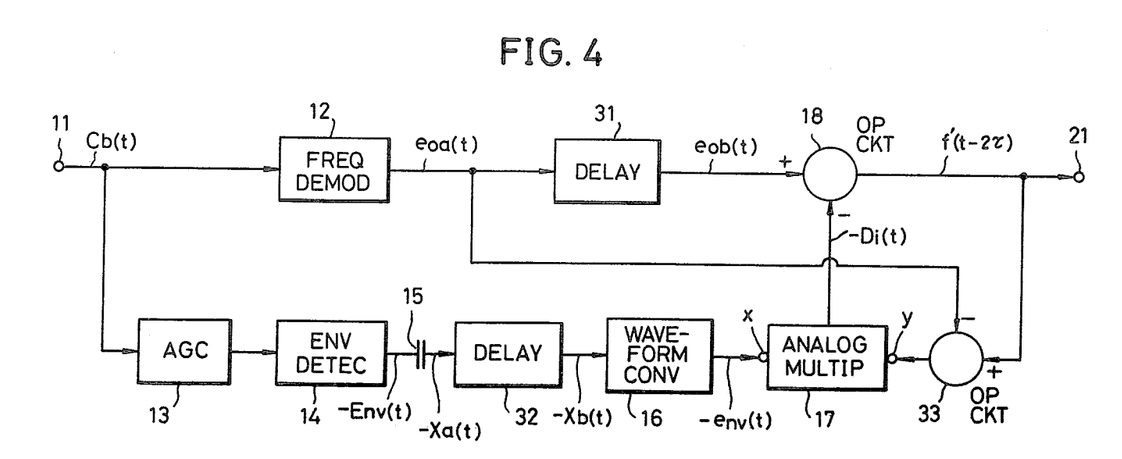
FIG. 4 is a block schematic diagram of a first embodiment of the interference distortion removing system according to the present invention.

The first embodiment of the system of the invention is described with reference to FIG. 4. In FIG. 4, those parts which are the same as or equivalent to corresponding parts in FIG. 1 are designated by like reference numerals or characters and will not be described in detail again.

The FM signal Cb(t), in which the level of the reflected signal $C(t-\tau)$ is larger than that of the directly-received wave C(t), is applied to the input terminal 11. A demodulated signal $e_{oa}(t)$ expressed by the following equation is obtained from the frequency modulator 12.

$$e_{oa}(t) = f(t-\tau) - \{f(t-\tau) - f(t)\} \times \frac{K_a \cos \{f(t-\tau) - f(t) + \theta\}}{1 + 2K_a \cos \{f(t-\tau) - f(t) + \theta\}} \tag{15}$$

where, $K_a = \frac{C(t)}{C(t-\tau)} < 1$

The output signal $e_{oa}(t)$ of the frequency modulator 12 is supplied, on one hand, to a delay circuit 31 for delaying the signal by the time $\tau$. A signal $e_{ob}(t)$ expressed by the following equation is supplied from the delay circuit 31 to the operation circuit 18 as a minuend.

$$e_{ob}(t) = f(t-2\tau) - \{f(t-2\tau) - f(t-\tau)\} \times \frac{K_a \cos \{f(t-2\tau) - f(t-\tau) + \theta\}}{1 + 2K_a \cos \{f(t-2\tau) - f(t-\tau) + \theta\}} \tag{16}$$

On the other hand, the input signal Cb(t) from the input terminal 11 is supplied, through the AGC circuit 13, to the envelope detection circuit 14. An envelope signal $-\text{Env}(t)$ expressed by the following equation is derived from the envelope detection circuit 14.

$$-\text{Env}(t) \approx -[1 + K_a \cos \{f(t-\tau) - f(t) + \theta\}] \tag{17}$$

This envelope signal $-\text{Env}(t)$ is passed through the capacitor 15 for suppressing DC component, by which its DC component is removed, and the envelope signal $-X_a(t)$ of its AC component is supplied to a delay circuit 32. This envelope signal $-X_a(t)$ of AC component is expressed by the following equation.

$$-X_a(t) = -K_a \cos \{f(t-\tau) - f(t) + \theta\} \tag{18}$$

The signal $-X_a(t)$ expressed by the equation (18) is delayed by the delay time $\tau$ at the delay circuit 32 from which a signal $-Xb(t)$ expressed by the following equation is derived.

$$-X_b(t) = -K_a \cos\{f(t-2\tau)-f(t-\tau)+\theta\} \quad (19)$$

The signal $-X_b(t)$ is supplied as a signal $-X(t)$ to the waveform conversion circuit 16 which comprises a circuit construction shown in FIG. 2 having the transfer characteristic of a hyperbolic function $Y=X/(1-2\ X)$ as indicated in FIG. 3.

The waveform conversion circuit 16 produces as output a converted envelope signal $-e_{nv}(t)$ given by the equation (12), which signal is supplied to the x input terminal of an analog multiplier 17.

A demodulated signal $f'(t-2\tau)$ derived from the operation circuit 18 as described hereinafter is supplied to an operation circuit 33 as a minuend signal. The output demodulated signal $e_{oa}(t)$ of the frequency demodulator 12 is supplied to the operation circuit 33 as a subtrahend signal. The operation circuit 33 carries out subtraction of the signals $f'(t-2\tau)$ and $e_{oa}(t)$. Here, since the second term in the right-hand side of Eq. (15) expressing the signal $e_{oa}(t)$ is extremely small, the following equation may be established.

$$e_{oa}(t) \approx f'(t-\tau)$$

Accordingly, a signal $\{f'(t-2\tau)-f'(t-\tau)\}$ is supplied from the operation circuit 33 to the y input terminal of the analog multiplier 17.

The analog multiplier 17 carries out switching the signal $$-\frac{X(t)}{1+2X(t)}$$

supplied from the waveform conversion circuit 16 in response to the signal supplied from the operation circuit 33. The analog multiplier 17 produces as output a distortion cancelling signal $-Di(t)$ given by the following equation.

$$-Di(t) = -\{f'(t-2\tau)-f'(t-\tau)\} \times \frac{K\cos\{f(t-2\tau)-f(t-\tau)+\theta\}}{1+2K\cos\{f(t-2\tau)-f(t-\tau)+\theta\}} \quad (20)$$

The distortion cancelling signal $-Di(t)$ is supplied to the operation circuit 18 as a subtrahend signal.

The operation circuit 18 carries out subtraction of the signal $e_{ob}(t)$ expressed by Eq. (16) from the delay circuit 31 and the signal $-Di(t)$ expressed by Eq. (20) from the analog multiplier 17. This subtraction operation is expressed by the following equation.

$$e_{ob}(t)-\{-Di(t)\}=f'(t-2\tau) \quad (21)$$

Therefore, a demodulated signal $f'(t-2\tau)$ from which the distortion component has been removed is obtained as output from the operation circuit 18 and is led out through the output terminal 21.

In actual practice, there exist many reflected signals. The delay time $\tau$ of the delay circuits 31 and 32 may be selected to be equal to the time difference the reflected signal among the reflected signals and the directly-received signal. The delay circuits 31 and 32 may be constituted so that their respective delay time $\tau$ is variably adjusted at the same time within a range between several $\mu$sec. and several hundreds $\mu$sec, for example, in response to the above described time difference dependent upon the signal wave receiving conditions.

The relation of the disposition of the delay circuit 32 and waveform conversion circuit 16 may be opposite to that of the above described embodiment. In other words, those circuits may be disposed so that the signal passed through the capacitor 15 is supplied to the waveform conversion circuit 16 and is thereafter supplied to the delay circuit 32.

In the above described embodiment of the invention, the AGC circuit 13 is provided in the branch signal system provided with the envelope detection circuit 14 but it may be provided commonly in the stage in front of the frequency demodulator 12 and the envelope detection circuit 14.

Figure 5:
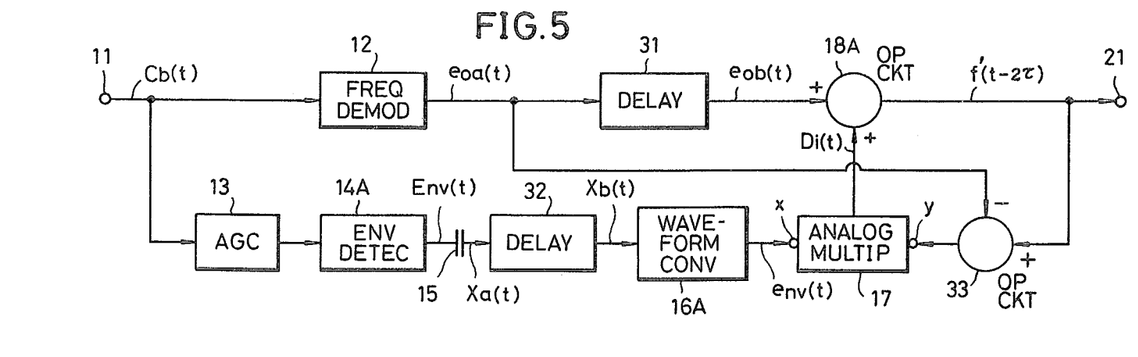
FIG. 5 is a block schematic diagram of a second embodiment of the interference distortion removing system according to the invention.

Next, the second embodiment of the system according to the invention will be described in conjunction with FIG. 5. In FIG. 5, those parts which are the same as or equivalent to corresponding parts in FIGS. 1 and 4 are designated by like reference numerals or characters and will not be described in detail again.

In this second embodiment of the invention, the envelope detection circuit 14A is adapted to detect the envelope of positive polarity of the amplitude fluctuation of the FM signal $Ca(t)$ and to produce an envelope signal Env(t).

This envelope signal Env(t) is passed through a capacitor 15 for suppressing DC component, by which its DC component is removed, and the envelope signal $X(t)$ of its AC component is supplied to a waveform conversion circuit 16A. This envelope signal $X(t)$ of AC component is expressed by the following equation.

$$X_a(t)=K_a \cos\{f(t-\tau)-f(t)+\theta\} \quad (18A)$$

The signal $X_a(t)$ expressed by Eq. (18A) is delayed by the time $\tau$ at the delay circuit 32 from the signal $X_b(t)$ expressed by the following equation is derived.

$$X_b(t)=K_a \cos\{f(t-2\tau)-f(t-\tau)+\theta\} \quad (19A)$$

The signal $X_b(t)$ is supplied to the waveform conversion circuit 16A as the signal $X(t)$.

Figure 6:
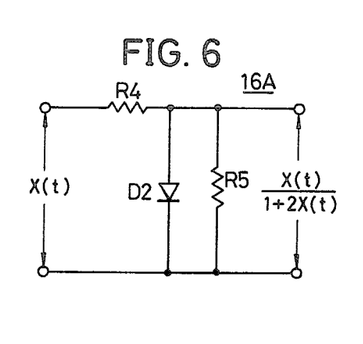
FIG. 6 is a circuit diagram of one embodiment of the waveform conversion circuit in the system illustrated in FIG. 5.
Figure 7:
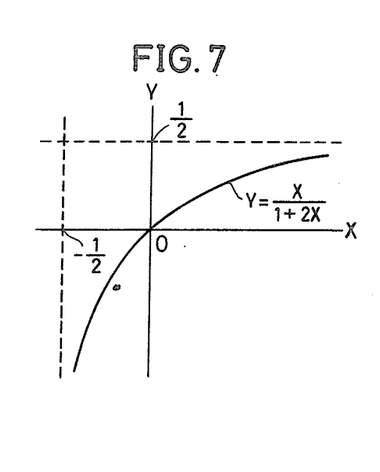
FIG. 7 is a graph indicating a characteristic of the waveform conversion circuit shown in FIG. 6.

The waveform conversion circuit 16A comprises resistors R4 and R5 connected in T formation and a diode D2 connected in parallel with the resistor R5 as shown in FIG 6. The waveform conversion circuit 16A of this circuit construction has a characteristic of a hyperbolic function $Y=X/(1+2\ X)$ as indicated in FIG. 7.

The waveform conversion circuit 16A produces as output a converted envelope signal $e_{nv}(t)$ given by the following equation, which signal is supplied to the x input terminal of the analog multiplier 17.

$$e_{nv}(t) = \frac{X(t)}{1+2X(t)}$$

The analog multiplier 17 thereupon carries out multiplication of the signal $e_{nv}(t)$ from the waveform conversion circuit 16A and the signal $\{f'(t-2\tau)-f'(t-\tau)\}$ from the operation circuit 33. The analog multiplier 17 thereby produces as output a distortion cancelling signal $Di(t)$ and supplies this signal to the operation circuit 18A.

In the operation circuit 18A, an operation of addition as indicated by the following equation is carried out.

$$e_{ob}(t) + Di(t) = f'(t - 2\tau) \quad (21A)$$

Therefore, as similarly in the above described first embodiment, a demodulated signal f'(t) from which the distortion component has been removed is obtained as output from the operation circuit 18A and is led out through an output terminal 21.

Figure 8:
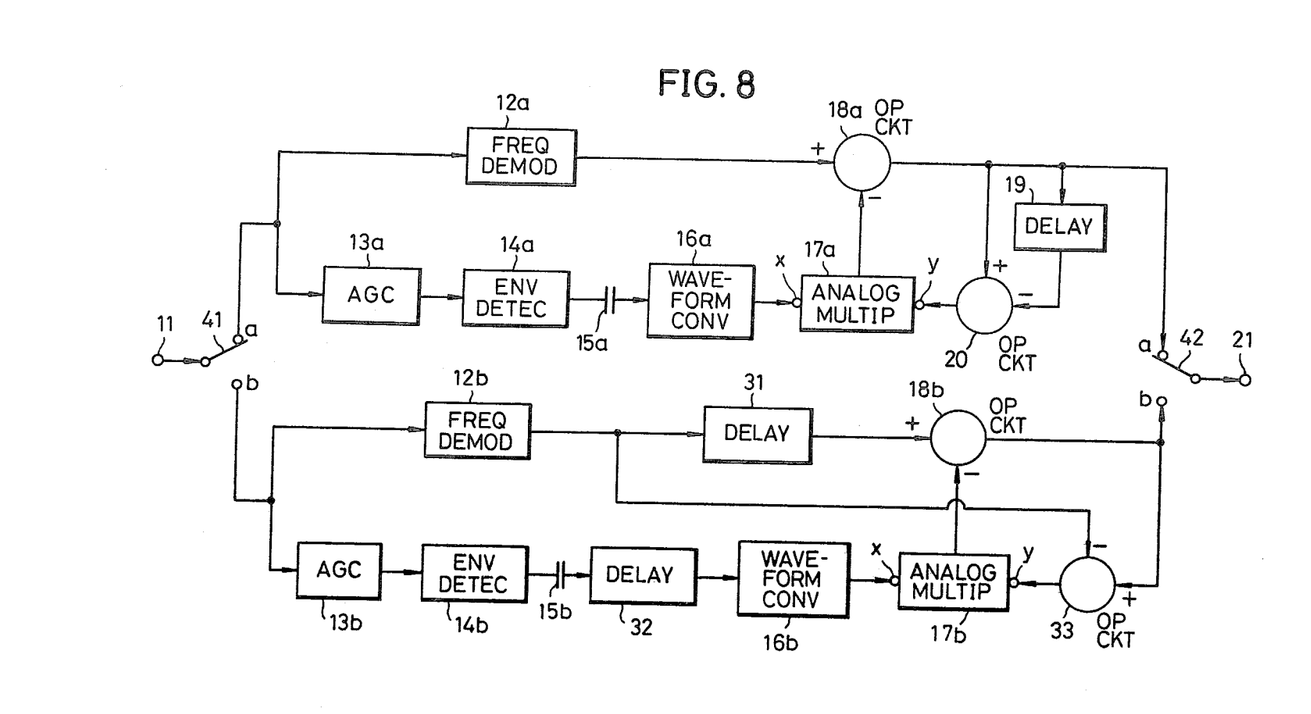
FIG. 8 is a block schematic diagram of a third embodiment of the interference distortion removing system according to the invention.

Next, the third embodiment of the system according to the invention will be described in conjunction with FIG. 8. The present embodiment is so constructed that the system of the block diagram shown in FIG. 1 and the system of the block diagram shown in FIG. 4 are selectively utilized for receiving the FM signal in correspondence with the magnitude of the levels of the directly-received signal and the reflected signal. In FIG. 8, those parts which are equivalent to corresponding parts in FIG. 1 are designated by like reference numerals with subscript a, and those parts which are equivalent to corresponding parts in FIG. 4 are designated by like reference numerals with subscript b. Those parts will not be described in detail again.

In a case where the level of the directly-received signal is larger than the level of the reflected signal, movable contacts of switches 41 and 42 are connected with contacts a. The input signal from the input terminal 11 is then supplied through the switch S1 to the block system same to that of FIG. 1 shown in an upper half part of FIG. 8. The demodulated signal in which the distortion has been removed is derived from the output terminal 21 through the switch S2. On the other hand, in a case where the level of the reflected signal is larger than the level of the directly-received signal, the movable contacts of the switches 41 and 42 are switched to contacts b. The input signal is thereby supplied through the switch S1 to the block system same to that of FIG. 4 shown in a lower half part of FIG. 8. The demodulated signal in which the distortion has been removed is derived from the output terminal 21 through the switch S2.

Further, this invention is not limited to these embodiments but various variations and modifications may be made without departing from the scope of the invention.

What is claimed is:

1. A system for removing interference distortion in the demodulated signal of a frequency-modulated signal comprising:
    means for demodulating an input frequency-modulated signal which has been subjected to interference by another frequency-modulated signal;
    means for detecting the envelope of fluctuation of the amplitude of the input frequency-modulated signal;
    automatic gain control means for controlling the level of at least said input frequency-modulated signal supplied to said envelope detection means;
    means for blocking the passage of the DC component of the output of said envelope detection means and passing only the AC component thereof;
    first delay means for delaying the output AC component of the blocking means by a specific delay time $\tau$;
    means having a transfer characteristic of a hyperbolic function, supplied with the output of the first delay means, and converting the waveform thereof;
    an analog multiplier supplied at the x input terminal thereof with the output of said waveform converting means and producing as output a distortion cancellation signal;
    second delay means for delaying the demodulated signal produced as output by said demodulating means and containing interference distortion by the specific delay time $\tau$;
    first operation means supplied with the output signal of the second delay means and with the output signal for distortion cancellation of said analog multiplier and carrying out an operation such as to substantially cancel the interference distortion of said demodulated signal with said distortion cancellation signal;
    second operation means supplied with the output signal of said first operation means and with the output signal of said demodulating means, thereby carrying out a signal combining operation and supplying the resulting output signal thereof to the y input terminal of said analog multiplier; and
    means for obtaining the output of said first operation means as a demodulated signal in which the interference distortion has been cancelled and thus removed.

2. A system for removing interference distortion as claimed in claim 1 in which: said envelope detection means detects the envelope of negative polarity of the amplitude fluctuation of said input frequency-modulated signal; said first operation means carries out substraction of said distortion cancellation signal of said analog multiplier from the demodulated signal of said second delay means; and said second operation means carried out substraction of the output signal of said demodulating means from the output signal of said first operation means.

3. A system for removing interference distortion as claimed in claim 1 in which: said envelope detection means detects the envelope of positive polarity of the amplitude fluctuation of said input frequency-modulated signal; said first operation means carries out addition of the demodulated signal from said second delay means and said distortion cancellation signal from said analog multiplier; and said second operation means carries out subtraction of output signal of said demodulating means from the output signal of said first operation means.

4. A system for removing interference distortion as claimed in claim 2 in which said waveform conversion means has a transfer characteristic of hyperbolic function expressed by $$Y = \frac{X}{1 - 2X},$$

where X and Y are the input signal and the output signal respectively of the waveform conversion means.

5. A system for removing interference distortion as claimed in claim 3 in which said waveform conversion means has a transfer characteristic of hyperbolic function expressed by $$Y = \frac{X}{1 + 2X},$$

where X and Y are the nput signal and the output signal respectively of the waveform conversion means.

6. A system for removing interference distortion in the demodulated signal of a frequency-modulated signal comprising:
- means for demodulating an input frequency-modulated signal which has been subjected to interference by another frequency-modulated signal;
- means for detecting the envelope of fluctuation of the amplitude of the input frequency-modulated signal;
- automatic gain control means for controlling the level of at least said input frequency-modulated signal supplied to said envelope detection means;
- means for blocking the passage of the DC component of the output of said envelope detection means and passing only the AC component thereof;
- means having a transfer characteristic of a hyperbolic function, supplied with said AC component, and converting the waveform thereof;
- first delay means for delaying the output signal of the waveform converting means by a specific delay time $\tau$;
- an analog multiplier supplied at the x input terminal thereof with the output of said first delay means and producing as output a distortion cancellation signal;
- second delay means for delaying the demodulaed signal produced as output by said demodulating means and containing interference distortion by the specific delay time $\tau$;
- first operation means supplied with the output signal of the second delay means and with the output signal for distortion cancellation of said analog multiplier and carrying out an operation such as to substantially cancel the interference distortion of said demodulated signal with said distortion cancellation signal;
- second operation means supplied with the output signal of said first operation means and with the output signal of said demodulating means, thereby carrying out a signal combining operation and supplying the resulting output signal thereof to the y input terminal of said analog multiplier; and
- means for obtaining the output of said first operation means as a demodulated signal in which the interference distortion has been cancelled and thus removed.

7. A system for removing interference distortion in the demodulated signal of a frequency-modulated signal comprising means for supplying an input frequency-modulated signal comprising a combined wave of a directly-received wave and a reflected wave, first and second demodulating system for demodulating the input frequency modulated signal, and means for selectively switching signal transmission paths so that the input frequency modulated signal passes through the first demodulating system in a case where the level of the directly-received wave is larger than the level of the reflected wave, while the input frequency-modulated signal passes through the second demodulating system in a case where the level of the reflected wave is larger than the level of directly-received signal, said first demodulating system comprising:
- first demodulating means for demodulating said input frequency-modulated signal;
- first envelope detection means for detecting the envelope of fluctuation of the amplitude of the input frequency-modulated signal;
- first automatic gain control means for controlling the level of at least said input frequency-modulated signal supplied to said first envelope detection means;
- first blocking means for blocking the passage of the DC component of the output of said first envelope detection means and passing only the AC component thereof;
- first waveform converting means having a transfer characteristic of a hyperbolic function, supplied with said AC component, and converting the waveform thereof;
- a first analog multiplier supplied at the x input terminal thereof with the output of said first waveform converting means and producing as output a distortion cancellation signal;
- first operation means supplied with the demodulated signal produced as output by said first demodulating means and containing interference distortion and with the output signal for distortion cancellation of said first analog multiplier and carrying out an operation such as to substantially cancel the interference distortion of said demodulated signal with said distortion cancellation signal;
- first delay means supplied with the output signal of said first operation means and delaying the same by a specific delay time $\tau_1$; and
- second operation means supplied with the output signal of said first operation means and with the output signal of said first delay means, thereby carrying out a signal combining operation and supplying the resulting output signal thereof to the y input terminal of said first analog multiplier;

said second demodulating system comprising:
- second demodulating means for demodulating an input frequency-modulated signal;
- second envelope detection means for detecting the envelope of fluctuation of the amplitude of the input frequency-modulated signal;
- second automatic gain control means for controlling the level of at least said input frequency-modulated signal supplied to said second envelope detection means;
- second blocking means for blocking the passage of the DC component of the output of said second envelope detection means and passing only the AC component thereof;
- second delay means for delaying said AC component by a specific delay time $\tau_2$;
- second waveform converting means having a transfer characteristic of a hyperbolic function, supplied with the output of the second delay means, and converting the waveform thereof;
- a second analog multiplier supplied at the x input terminal thereof with the output of said second waveform converting means and producing as output a distortion cancellation signal;
- third delay means for delaying the demodulated signal produced as output by said second demodulating means and containing interference distortion by the specific delay time $\tau_2$;
- third operation means supplied with the output signal of the third delay means and with the output signal for distortion cancellation of said second analog multiplier and carrying out an operation such as to substantially cancel the interference distortion of said demodulated signal with said distortion cancellation signal;
- fourth operation means supplied with the output signal of said third operation means and with the output signal of said second demodulating means, thereby carrying out a signal combining operation and supplying the resulting output signal thereof to the y input terminal of said second analog multiplier; and means for obtaining the output of said first or third operation means as a demodulated signal in which the interference distortion has been cancelled and thus removed.

* * * * *